US011270853B2

(12) United States Patent
Omori et al.

(10) Patent No.: US 11,270,853 B2
(45) Date of Patent: Mar. 8, 2022

(54) FLAT SWITCH

(71) Applicant: MINEBEA MITSUMI Inc., Nagano (JP)

(72) Inventors: Kiyoshi Omori, Machida (JP); Yasutoshi Obata, Yokohama (JP)

(73) Assignee: MINEBEA MITSUMI INC., Nagano (JP)

( * ) Notice: Subject to any disclaimer, the term of this patent is extended or adjusted under 35 U.S.C. 154(b) by 95 days.

(21) Appl. No.: 16/623,041

(22) PCT Filed: Jun. 25, 2018

(86) PCT No.: PCT/JP2018/024023
§ 371 (c)(1),
(2) Date: Dec. 16, 2019

(87) PCT Pub. No.: WO2019/004133
PCT Pub. Date: Jan. 3, 2019

(65) Prior Publication Data
US 2021/0151264 A1    May 20, 2021

(30) Foreign Application Priority Data

Jun. 30, 2017  (JP) .............................. JP2017-129734

(51) Int. Cl.
*H01H 9/02* (2006.01)
*H01H 36/00* (2006.01)

(52) U.S. Cl.
CPC .............. *H01H 9/02* (2013.01); *H01H 36/00* (2013.01)

(58) Field of Classification Search
CPC ................................. H01H 9/02; H01H 36/00
See application file for complete search history.

(56) References Cited

U.S. PATENT DOCUMENTS

| 4,634,015 A | 1/1987 | Taylor |
| 5,012,043 A | 4/1991 | Seymour |

(Continued)

FOREIGN PATENT DOCUMENTS

| JP | 54-158265 U   | 11/1979 |
| JP | 11-329130 A   | 11/1999 |

(Continued)

OTHER PUBLICATIONS

International Search Report for corresponding International Application No. PCT/JP2018/024023 dated Sep. 4, 2018.

(Continued)

*Primary Examiner* — Jared Fureman
*Assistant Examiner* — Esayas G Yeshaw
(74) *Attorney, Agent, or Firm* — Pearne & Gordon LLP

(57) ABSTRACT

A flat switch is provided that prevents the flat switch from protruding and thereby causing a poor appearance even in a case where it is required to install a switch box so that an end part on an opening side of the switch box is not positioned on a predetermined distance or deeper side with respect to an appearance surface that is a surface of a wall. A flat switch (1) of the present invention is a flat switch (1) that is installed in a switch box (100) having a bottom part (101) and a vertical wall part (102) which is provided along an outer periphery of the bottom part (101). The switch box (100) is installed so that, with respect to an appearance surface that is a front surface of a wall, a peripheral edge part (102A) is not positioned on a predetermined distance or deeper side in a depth direction of the wall from the appearance surface. The flat switch (1) includes a sensor unit (20) whose thickest part in a direction from the peripheral edge part (102A) of the switch box (100) to the bottom part (101) is thicker than a predetermined distance in a state of being installed in the switch box and whose outer shape is smaller than an inner shape of the peripheral edge part (102A) of the switch box (100).

6 Claims, 11 Drawing Sheets

(56) References Cited

U.S. PATENT DOCUMENTS

| 6,875,922 B1 | 4/2005 | Petak et al. |
| 2010/0226100 A1 | 9/2010 | Johnson et al. |
| 2016/0041584 A1* | 2/2016 | DeSilva ............... G06F 1/1632 320/114 |
| 2017/0201253 A1* | 7/2017 | Omori .................. H01H 9/0207 |
| 2017/0207042 A1* | 7/2017 | Tress .................... H05B 47/19 |
| 2017/0213660 A1* | 7/2017 | Kitahara ............... H01H 13/14 |
| 2017/0359068 A1 | 12/2017 | Omori et al. |
| 2019/0042025 A1* | 2/2019 | Tsuji ................... H03K 17/962 |

FOREIGN PATENT DOCUMENTS

| JP | 2016-162707 A | 9/2016 |
| JP | 2017-034771 A | 2/2017 |

OTHER PUBLICATIONS

Written Opinion for corresponding International Application No. PCT/JP2018/024023 dated Sep. 4, 2018.
English translation of Written Opinion for corresponding International Application No. PCT/JP2018/024023 dated Sep. 4, 2018.
International Preliminary Report on Patentability for corresponding International Application No. PCT/JP2018/024023 dated Dec. 31, 2019.
Notice of Reasons for Refusal dated Jun. 1, 2021 for corresponding Japanese Application No. 2017-129734 and English translation.

* cited by examiner

FLAT SWITCH

TECHNICAL FIELD

The present invention relates to a flat switch.

BACKGROUND ART

Patent Literature 1 discloses a flat switch that has a sensor unit of an electrostatic capacitance type and is capable of, for example, being installed so as not to protrude from an exterior wall.

DOCUMENT LIST

Patent Literature

Patent Literature 1: Japanese Patent Application Publication No. 2016-162707

SUMMARY OF INVENTION

Technical Problem

In Japan, installation of a switch box is prescribed with reference to a rear surface of a wall. The thickness of the wall itself is equal to or more than the thickness of a sensor unit that is a switch part of a flat switch and therefore, even if the sensor unit is provided on the switch box, the sensor unit can be arranged so as not to protrude from the wall.

On the other hand, in the U.S., in order to perform a flame retardant test conforming to UL standards, it is necessary to install a switch box in compliance with the standard for electrical wiring and electrical installation of equipment called NEC (National Electrical Code) and it is required to install the switch box so that an end part on an opening side of the switch box is not positioned on a predetermined distance (specifically, 6.4 mm) or deeper side with respect to an appearance surface that is a front surface of a wall.

Therefore, in a case where the sensor unit is provided on the end part on the opening side of the switch box, for example, even a sensor unit of a relatively thin type has a thickness of around 9 mm and therefore, the sensor unit itself protrudes from the appearance surface, resulting in a state in which a flat switch is installed with a poor appearance.

The present invention has been made in view of the above and it is an object of the present invention to provide a flat switch that prevents the flat switch from protruding and thereby causing a poor appearance even in a case where it is required to install a switch box so that an end part on an opening side of the switch box is not positioned on a predetermined distance or deeper side with respect to an appearance surface that is a front surface of a wall.

Solution to Problem

The present invention is grasped by the following configuration to achieve the above purpose.
(1) A flat switch of the present invention is a flat switch to be installed in a switch box having a bottom part and a vertical wall part, the vertical wall part being provided along an outer periphery of the bottom part. The switch box is installed so that, with respect to the appearance surface that is the front surface of a wall, a peripheral edge part of the vertical wall part that is an end part on an opening side of the switch box is not positioned on a predetermined distance or deeper side in a depth direction of the wall from the appearance surface. The flat switch includes a sensor unit whose thickest part in a direction from the peripheral edge part of the switch box to the bottom part is thicker than the predetermined distance in a state of being installed in the switch box but whose outer shape is smaller than an inner shape of the peripheral edge part of the switch box.
(2) In the above configuration (1), an attaching plate that is attached to the switch box and attaches the sensor unit is provided. The attaching plate includes: an accommodating part that accommodates the sensor unit; and an outer peripheral edge part that is provided on a tip-end side outer periphery which is positioned on a side of the accommodating part where the sensor unit is inserted and that is arranged on a peripheral edge part on a tip-end side of the switch box. On the outer peripheral edge part, first screw holes corresponding to screw fixing parts of the switch box which are positioned on an inside of the switch box is formed.
(3) In the above configuration (2), each of the screw fixing parts of the switch box is bent from the peripheral edge part toward the inside of the switch box; and has a step height, which goes down in a direction from the peripheral edge part of the switch box toward the bottom part, between itself and the peripheral edge. The attaching plate includes folded-back parts each of which is provided at a position corresponding to each of the screw fixing parts in attachment to the switch box and is folded back from the outer peripheral edge part to a back side of the outer peripheral edge part which is to face a side of the screw fixing parts so as be fitted to the step height. The first screw hole is also formed in each of the folded-back parts.
(4) In the above configuration (3), the folded-back parts are folded back so as to separate from the outer peripheral edge part.
(5) In any one of the above configurations (2) to (4), the accommodating part includes: a bottom surface; a side wall part that is provided in a periphery of the bottom surface; and an elastic part that is provided on the bottom surface and elastically supports the sensor unit. The sensor unit has a second screw hole for passing an engagement screw that engages the sensor unit on a side of the bottom surface against an elastic force of the elastic part and performs positioning in a depth direction of the sensor unit. The bottom surface has an engagement screw fixing hole for fixing the engagement screw at a position corresponding to the second screw hole when the sensor unit is accommodated in the accommodating part.
(6) In any one of the above configurations (2) to (5), the accommodating part has a depth allowing the sensor unit to be arranged to be flush with at least the outer peripheral edge part.
(7) In any one of the above configurations (1) to (6), the switch box is a wide-type switch box that allows two or more switches to be arranged; and the sensor unit has two or more sensor parts each having one sensor substrate.
(8) In any one of the above configurations (1) to (7), the predetermined distance is 6.4 mm.

Effects of Invention

According to the present invention, a flat switch can be provided that prevents the flat switch from protruding and thereby causing a poor appearance even in a case where it is required to install a switch box so that an end part on an opening side of the switch box is not positioned on a predetermined distance or deeper side with respect to an appearance surface that is a front surface of a wall.

DESCRIPTION OF EMBODIMENTS

Hereinafter, an embodiment of the present invention (hereinafter, referred to as "embodiment") will be described in detail with reference to attached drawings.

It should be noted that identical components are denoted by identical numbers through the entire description of the embodiment.

Figure 1:
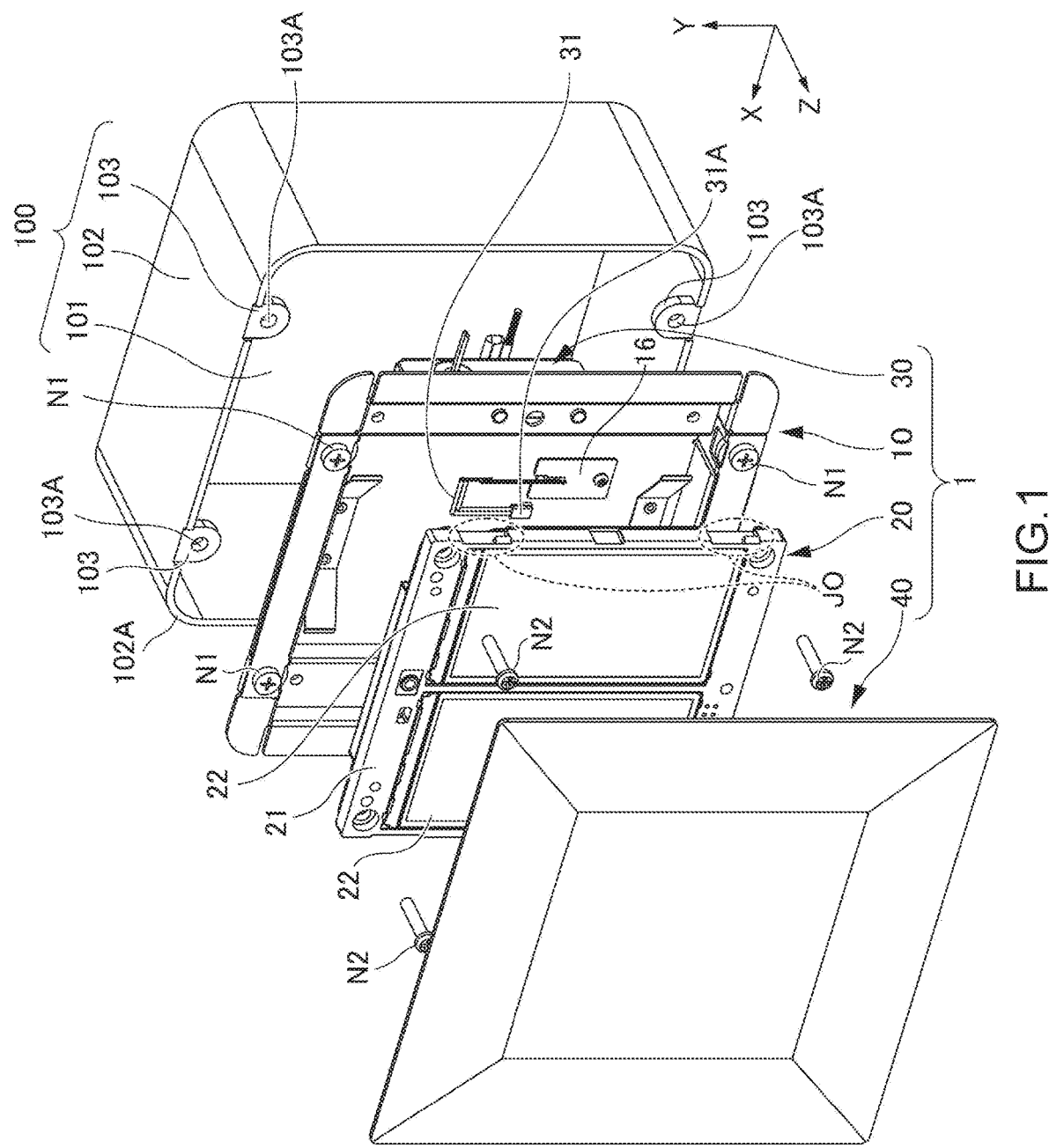
FIG. 1 An exploded perspective view for explaining an overall configuration of a flat switch of an embodiment of the present invention.

FIG. 1 is an exploded perspective view for explaining an overall configuration of a flat switch 1 of an embodiment of the present invention.

As shown in FIG. 1, in the present embodiment, as a switch box 100 that is an attachment object of the flat switch 1, the one commonly used in the U.S. is assumed.

Specifically, the switch box 100 includes: a bottom part 101 whose outer shape is nearly rectangular; and a vertical wall part 102 that is provided along an outer periphery of the bottom part 101.

In the following description, a direction perpendicular to an X-axis direction (vertical direction) on the bottom part 101 is represented as a Y-axis direction and a direction perpendicular to an X-Y plane (depth direction) is represented as a Z-axis direction.

In addition, the switch box 100 includes screw fixing parts 103 each of which is folded from a peripheral edge part 102A of a vertical wall part 102 that is an end part on an opening side of the switch box 100 toward an inside of the switch box 100 so as to be positioned at the inside of the switch box 100 and each of which has a step height going down to a deeper side (Z-axis direction negative side) between itself and the peripheral edge part 102A (that is, a step height going down in a direction from the peripheral edge part 102A of the switch box 100 toward the bottom part 101).

In the present embodiment, a case where the switch box 100 is a wide-type switch box 100 that allows two switches to be arranged is shown.

The switch box 100 has a pair of screw fixing parts 103 provided on a pair of opposing sides of the peripheral edge part 102A (a side along an X-axis direction on a Y-axis direction positive side and a side along the X-axis direction on a Y-axis direction negative side) so that each fixes one switch.

That is, on the side along the X-axis direction on the Y-axis direction positive side, a pair of the screw fixing parts 103 is provided with a distance apart between each other on the X-axis direction; while on the side along the X-axis direction on the Y-axis direction negative side, a pair of the screw fixing parts 103 is provided with a distance apart between each other on the X-axis direction.

A pair of the screw fixing parts 103 on one side and a pair of the screw fixing parts 103 on the other side are mutually opposed with a distance apart in the Y-axis direction.

As can be seen from the above description, the switch box 100 is configured to have a total of four pieces of the screw fixing part 103.

In addition, on each of the screw fixing parts 103, a first screw threaded hole 103A on which a screw threaded groove, not illustrated, for threadedly engaging a screw N1 is formed is formed.

It should be noted that it is not necessary to limit the switch box 100 to a wide-type one that allows two switches to be arranged and it may be a wide-type one that allows three or more switches to be arranged.

In addition, this switch box 100 is installed so that the peripheral edge part 102A of the vertical wall part 102 is not positioned on a predetermined distance or deeper side (Z-axis direction negative side) (specifically, 6.4 mm) with respect to an appearance surface that is a front surface (outer surface) of a wall (for example, exterior wall).

On the other hand, the flat switch 1 includes: an attaching plate 10 that is attached to the switch box 100; a sensor unit 20 that is attached so as to be accommodated on a front side (Z-axis direction positive side) of the attaching plate 10; a power supply unit 30 that is attached to a back side (Z-axis direction negative side) of the attaching plate 10; and a top panel 40 that is attached to the sensor unit 20 and closes an opening part of a wall on which the switch box is provided.

[Top Panel]

A top panel 40 includes: a transparent or translucent plate (part that can be seen in FIG. 1) that is positioned at a most front side (Z-side direction positive side); and a film (not illustrated) that is stuck on a back surface (surface on the Z-axis direction negative side) of the plate. On the film, printing of figures, characters, and the like that indicate a position for performing a switch operation and the like has been performed.

In addition, the film is configured to allow a predetermined area where at least figures, characters, and the like are printed to transmit light.

Specifically, the predetermined area where figures, characters, and the like are printed is in a state of a semitransparent mirror.

Therefore, when surroundings are dark such as at night, if, as described later, the sensor unit 20 emits light, the light causes figures, characters, and the like to be displayed as if they floated up.

On the other hand, when surroundings are bright such as during daytime, light is reflected by a semitransparent mirror and therefore, drawn figures, characters, and the like are brought into a state where they are visually recognized as-is by users, and a side of a back surface (surface on a Z-axis direction negative side) of the film is not seen transparently and thus the appearance is not deteriorated.

In addition, on a side of a back surface (surface on the Z-axis direction negative side) of the top panel 40, engaging claws having an L shape (not illustrated) that engage with engagement parts JO provided on a side surface of the sensor unit 20 are provided and are detachably attached to the sensor unit 20.

[Power Supply Unit]

The power supply unit 30 includes, though detailed illustration is omitted, a control circuit and the like that control power which is supplied to the sensor unit 20; and further includes a lead-out wiring 31 having a connector 31A for electrical connection to the sensor unit 20.

In addition, the lead-out wiring 31 is led out from the attaching plate 10 to a side where the sensor unit 20 is arranged and the connector 31A is connected to the sensor unit 20; accordingly, an electrical connection is performed between the power supply unit 30 and the sensor unit 20.

[Attaching Plate]

Next, the attaching plate 10 will be described with reference mainly to FIG. 2 to FIG. 7.

Figure 2:
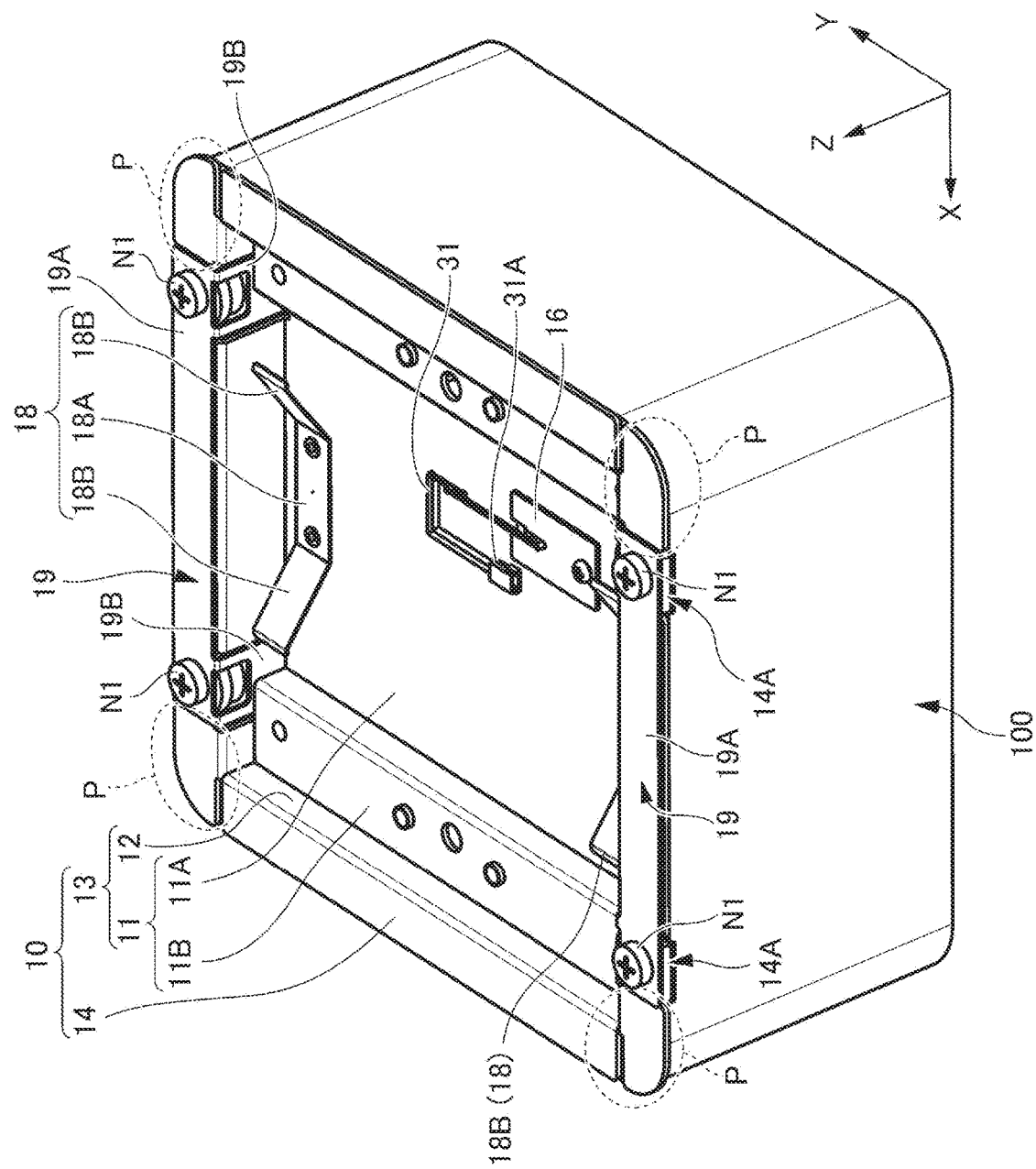
FIG. 2 A perspective view showing a state in which an attaching plate is attached to a switch box with a power supply unit of the embodiment of the present invention being attached.

FIG. 2 is a perspective view showing a state in which the attaching plate 10 is attached to the switch box 100 with the power supply unit 30 being attached.

Figure 3:
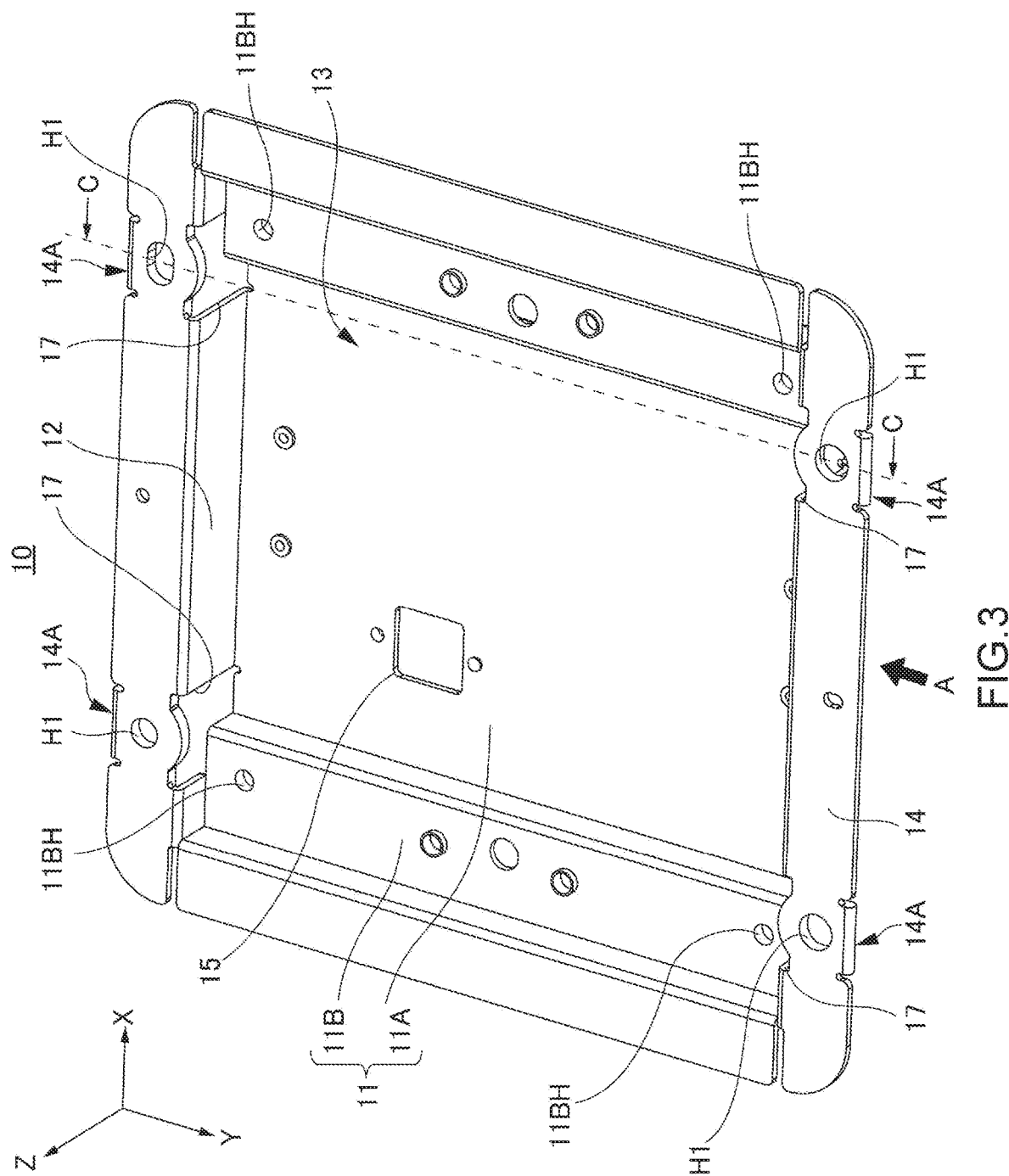
FIG. 3 A perspective view when viewing a front side, where a sensor unit is attached, of an attaching plate of the embodiment of the present invention.
Figure 4:
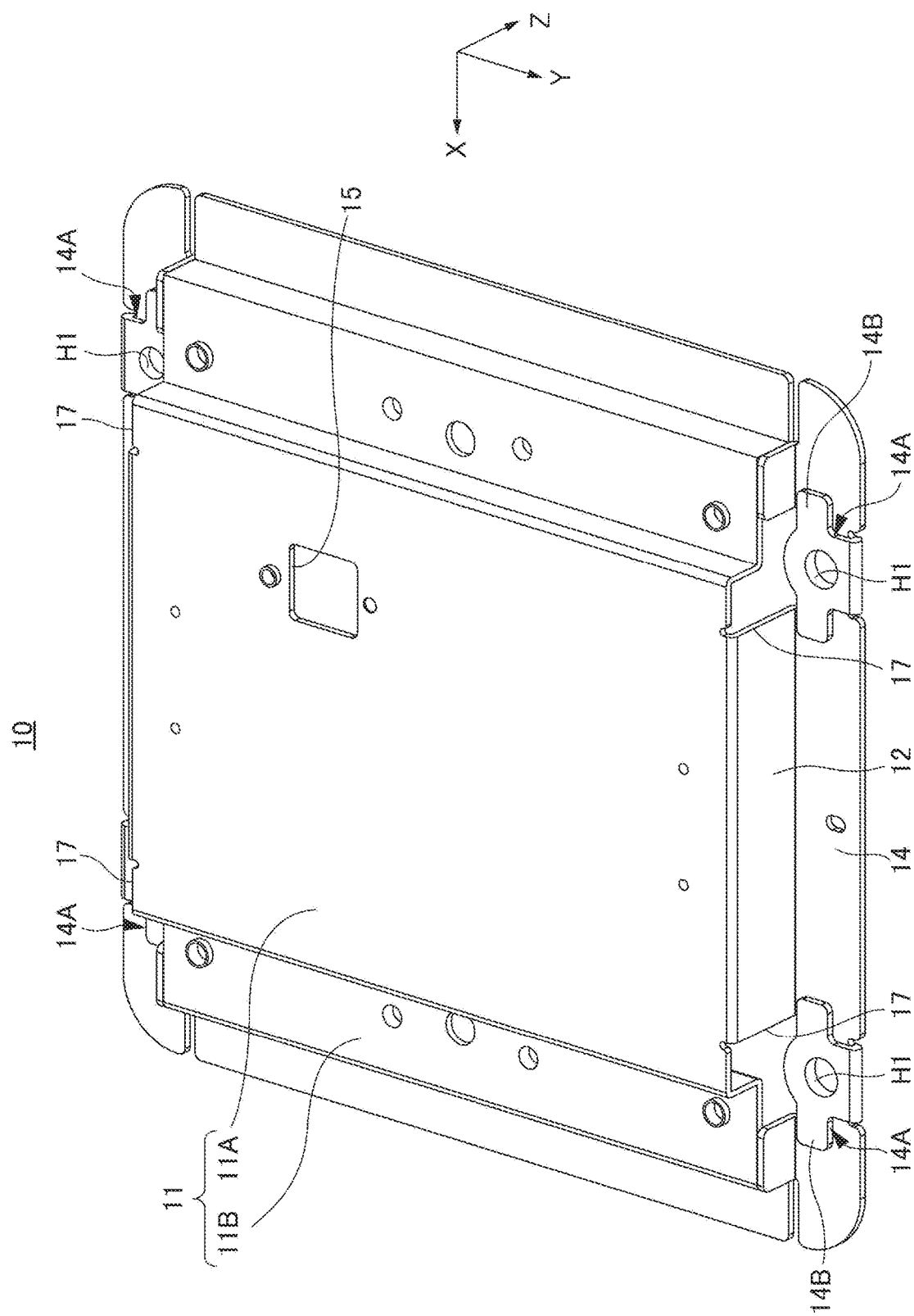
FIG. 4 A perspective view when viewing a back side, where a power supply unit is attached, of the attaching plate of the embodiment of the present invention.
Figure 5:
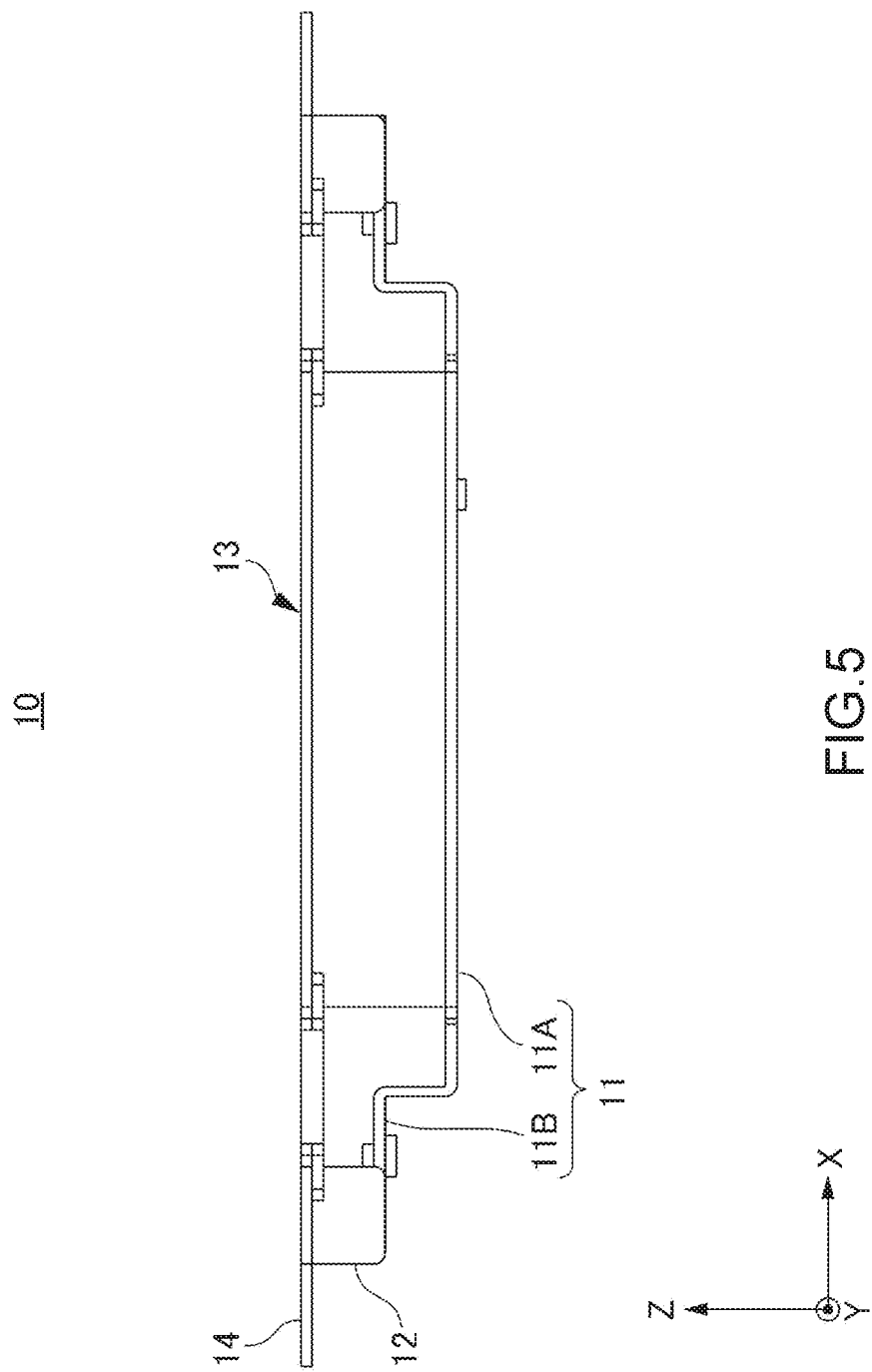
FIG. 5 A side view when viewing the attaching plate of the embodiment of the present invention from the side of arrow A in FIG. 3.

In addition, FIG. 3 is a perspective view when viewing a front side (Z-axis direction positive side), where the sensor unit 20 is attached, of the attaching plate 10; an FIG. 4 is a perspective view when viewing a back side (Z-axis direction negative side), where the power supply unit 30 is attached, of the attaching plate 10; and FIG. 5 is a side view when viewing the attaching plate 10 from the side of arrow A in FIG. 3.

Figure 6:
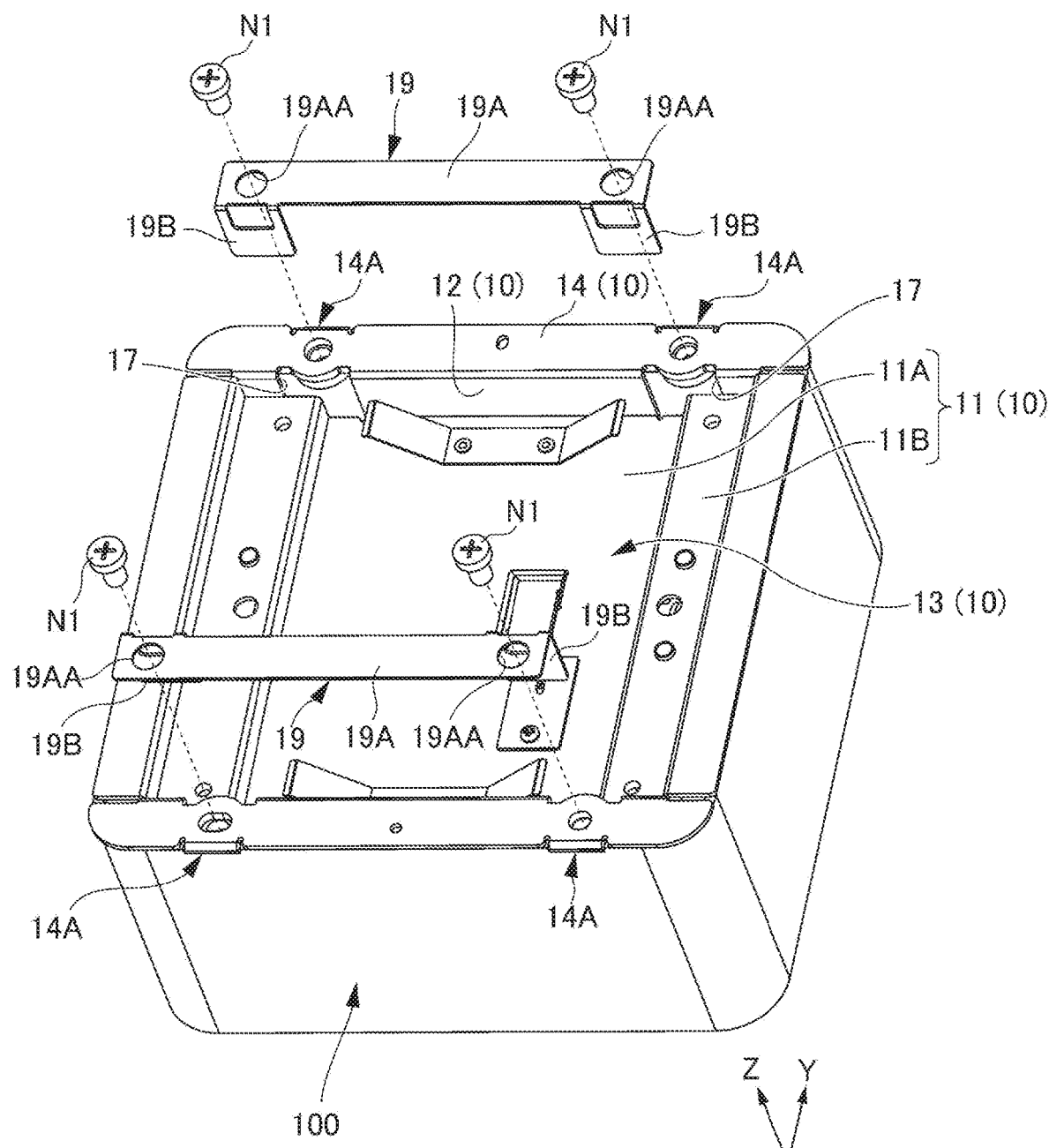
FIG. 6 A perspective view showing the attaching plate of the embodiment of the present invention being attached to the switch box.

In addition, FIG. 6 is a perspective view showing the attaching plate 10 being attached to the switch box 100; and FIG. 7 is a view for explaining a folded-back part 14A.

The attaching plate 10 is formed in a manner that one piece of plate material is folded; and as shown in FIG. 2 to FIG. 6, includes: an accommodating part 13 having a bottom surface 11 and a side wall part 12 which is provided in a periphery of the bottom surface 11; and an outer peripheral edge part 14 that is provided so as to be folded outward on a tip-end side outer periphery positioned on a side of the accommodating part 13 where the sensor unit is inserted, and that is arranged on the peripheral edge part 102A (see FIG. 1) on a tip-end side of the switch box 100.

The bottom surface 11 includes, when viewed in a direction along a side of the switch box 100 where the screw fixing parts 103 are provided (X axis direction), a central side bottom surface 11A and lateral side bottom surfaces 11B provided on both sides of the central side bottom surface 11A, so as to be fitted to the shape of the sensor unit 20 described later. The central side bottom surface 11A is formed so as to be one-step deeper than the lateral side bottom surfaces 11B when viewed from a front side (Z-axis direction positive side).

Further, though the reason will be described later, on the central side bottom surface 11A, as shown in FIG. 2, both a fixing part 18A that is riveted to the central side bottom surface 11A and an elastic part 18 that has a pair of elastic sides 18B each of which is provided on both sides of the fixing part 18A are fixed.

It should be noted that although, in the present embodiment, the elastic part 18 is provided in pair separately in a direction (Y-axis direction) orthogonal to a direction (X-axis direction) along sides where the screw fixing parts 103 of the switch box 100 are provided, an arrangement aspect of the elastic part 18 is not limited to the above aspect.

The elastic part 18 may be an arrangement aspect other than the above aspect as long as it is an arrangement aspect capable of elastically supporting the sensor unit 20.

In addition, the elastic part 18 is not necessarily limited to using an elastic member having a leaf spring structure as in the present embodiment, and it may be the one using an elastic member having another structure such as a spring structure, or the like.

On the other hand, as shown in FIG. 3 and FIG. 4, on the side wall part 12, recessed parts 17 corresponding to the screw fixing parts 103 are formed at positions facing the screw fixing parts 103 (see FIG. 1) in attachment to the switch box 100.

As described above, in the present embodiment, the switch box 100 that is commonly used in the U.S. is assumed. However, the standard in the U.S. only prescribes a positional relation of the first screw threaded holes 103A (see FIG. 1) of the switch box 100 and therefore, the length itself of the screw fixing part 103 where each of the first screw threaded holes 103A is formed varies.

Then, the recessed parts 17 corresponding to the screw fixing parts 103 are provided on the side wall part 12 and thereby, even when there are variations in the length itself of the screw fixing parts 103, it is prevented that the screw fixing parts 103 abut the side wall part 12 and the attaching plate 10 cannot be attached to the switch box 100.

In addition, the attaching plate 10 includes, as described above, the outer peripheral edge part 14 that is arranged on the peripheral edge part 102A (see FIG. 1) of the switch box 100 and therefore, as shown in FIG. 2, when being attached to the switch box 100, it can close an opening of the switch box 100.

Further, on the central side bottom surface 11A, as shown in FIG. 3 and FIG. 4, a lead-out port 15 for leading out lead-out wiring 31 (see FIG. 1) of the power supply unit 30 (see FIG. 1), which is attached to the back side (Z-axis direction negative side) of the attaching plate 10, to the front side (Z-axis positive side) where the sensor unit 20 is attached is formed. Also for this lead-out port 15, a lid part 16 (see FIG. 1) is attached so as to close the lead-out port 15 in a state where the lead-out wiring 31 is led out.

Further, as shown in FIG. 2 and FIG. 6, in attaching the attaching plate 10 to the switch box 100 with the screws N1, closing plates 19 for closing the recessed parts 17 (see FIG. 6) formed on the side wall part 12 are fastened together with the attaching plate 10 with the screws N1.

Specifically, as shown in FIG. 6, the closing plates 19 are arranged on the outer peripheral edge part 14 of the attaching plate 10 and each includes: an attaching plate part 19A that has through holes 19AA for passing the screws N1; and closing plate parts 19B that are folded from the attaching plate part 19A to a side of the side wall part 12 so as to perform arrangement at a position corresponding to the recessed parts 17.

Thus, in the switch box 100, the attaching plate 10 is attached so as to close the opening of the switch box 100 and both the lead-out port 15 and recessed parts 17 which are formed on the attaching plate 10 can also be closed; and therefore, generation of such a large gap as becoming a problem on the UL standards can be prevented and the UL standards prescribing that the opening of the switch box 100 should be closed without a gap can be satisfied.

Further, there are many in which the length of each of the screw fixing parts 103 of the switch box 100 is such a degree that does not cause contact with the side wall part 12 of the attaching plate 10 in a range of dispersion. Therefore, when the switch box 100 thus configured is selected and used, the recessed parts 17 do not need to be provided and also, the closing plates 19 can be omitted.

In addition, if the lead-out port 15 is large, the lid part 16 is necessary in order to satisfy the UL standards. However, with the lead-out port 15 having a size that is small enough not to cause a problem on the UL standards, the lid part 16 can be omitted.

However, with a configuration in which the recessed parts 17 are provided and the closing plates 19 close the recessed parts 17, if the length of each of the screw fixing parts 103 (see FIG. 1) of the switch box 100 is long and each of the closing plates 19, itself, becomes an obstacle, the closing plates 19 are avoided from being used and thereby, the recessed parts 17 for accepting the screw fixing parts 103 are brought into an open state and accordingly the attaching plate 10 can be attached. Thus, time and effort to select the switch box 100 can be saved.

It should be noted that if, thus, the closing plates 19 are not used and the recessed parts 17 are open, the UL standards cannot be satisfied; however, since it is not obligatory to satisfy the UL standards, installation of the flat switch 1 does not become impossible.

Meanwhile, as described above, when the attaching plate 10 is manufactured by bending processing (for example, pressing molding), the attaching plate 10 can be manufactured at low cost; however, in order to make bending processing easily performed, it is difficult to increase the plate thickness of the attaching plate 10.

Then, with reference to FIG. 1, as previously described, each of the screw fixing parts 103 of the switch box 100 is formed so as to have a step height that goes down on a deeper side (Z-axis direction negative side) between itself and the peripheral edge part 102A.

Therefore, if the screws N1 are fastened too tightly when the attaching plate 10 is fixed to the switch box 100 with the screws N1 as shown in FIG. 2, parts P each of which is enclosed by a dotted line in the outer peripheral edge part 14 of the attaching plate 10 may be deformed so as to be lifted up on a side separating from the switch box 100.

If so, the parts P will push up the back surface (surface on the Z-axis direction negative side) of the top panel 40 (see FIG. 1) in a direction separating from the attaching plate 10.

In addition, as described earlier, on the side of the back surface (Z-axis direction negative side) of the top panel 40 (see FIG. 1), the engaging claws having an L shape (not illustrated) that engages with the engagement parts JO provided on the side surface of the sensor unit 20 (see FIG. 1) are provided. However, as mentioned above, if the top panel 40 is pushed up in a direction separating from the attaching plate 10, the top panel 40 separates also from the sensor unit 20 which is attached to the attaching plate 10 and this may cause a failure in engaging with the sensor unit 20.

Therefore, in the present embodiment, as shown in FIG. 4, the attaching plate 10 includes the folded-back parts 14A each of which is provided at a position corresponding to each of the screw fixing parts 103 in attachment to the switch box 100 and is folded back from the outer peripheral edge part 14 to a back side (Z-axis direction negative side), which is to face a side of the screw fixing parts 103, of the outer peripheral edge part 14 so as to be fitted to the step height of each of the screw fixing parts 103.

In addition, as shown in FIG. 3 and FIG. 4, on the folded-back parts 14A and the outer peripheral edge part 14 positioned on the folded-back parts 14A, first screw holes H1 which are fixed to the screw fixing parts 103 (see FIG. 1) of the switch box 100 (see FIG. 1) and allow the passing of screws N1 (see FIG. 1 and FIG. 2) for attaching the attaching plate 10 to the switch box 100 are formed.

Thus, the folded-back parts 14A which are fitted into the step heights of the screw fixing parts 103 are provided and therefore, stress which is added to the outer peripheral edge part 14 by an influence of the step heights in fastening the screws N1 can be reduced; and even if the screws N1 are firmly fastened, it can be prevented (restrained) that the parts P each of which is enclosed by a dotted line in the outer peripheral edge part 14 of the attaching plate 10 are deformed so as to be lifted up on a side separating from the switch box 100, as described above.

This folded-back parts 14A may be folded back so as to contact the back side (Z-axis direction negative side) of the outer peripheral edge part 14 as described with reference to FIG. 7; however, it is preferable to be folded back so as to separate from the outer peripheral edge part 14 to some extent; and the following provides a specific description with reference to FIG. 7 and FIG. 8.

FIG. 7 is a view for explaining the folded-back parts 14A and is a view corresponding to a cross-section along line C-C shown in FIG. 3.

Figure 7A:
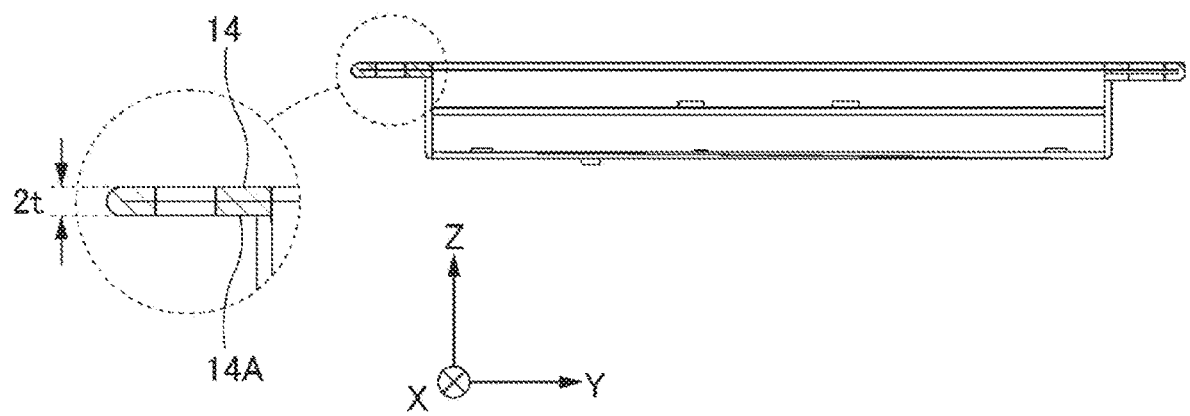
FIG. 7 A view for explaining a folded-back part of the embodiment of the present invention.
Figure 7B:
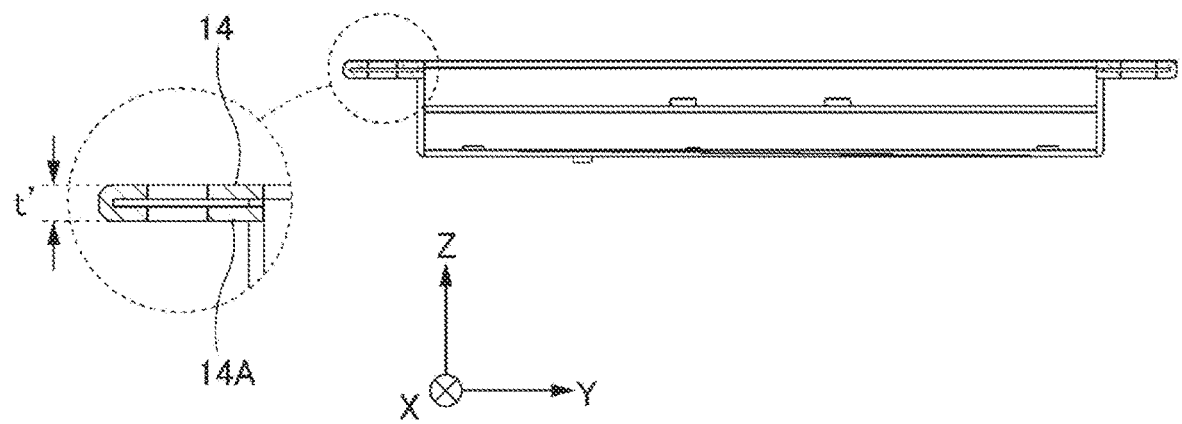

FIG. 7A is a view showing a case in which each of the folded-back parts 14A is folded back so as to contact the back side (Z-axis direction negative side) of the outer peripheral edge part 14; and FIG. 7B is a view showing a case in which each of the folded-back parts 14A is folded back so as to separate from the outer peripheral edge part 14 to some extent.

FIG. 8 is an enlarged view of a periphery of one of the screw fixing parts 103 when the attaching plate 10 is arranged so that the outer peripheral edge part 14 contacts the peripheral edge part 102A of the switch box 100.

Figure 8A:
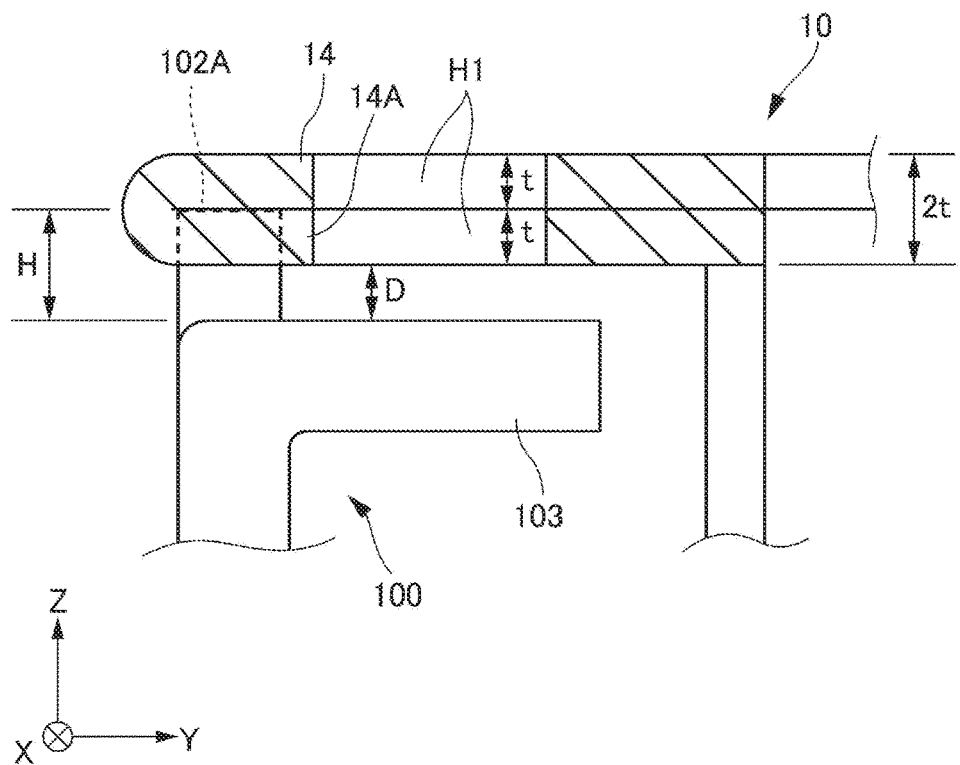
FIG. 8 An enlarged view of a periphery of one screw fixing part when the attaching plate is arranged so that an outer peripheral edge part of the embodiment of the present invention contacts a peripheral edge part of the switch box.
Figure 8B:
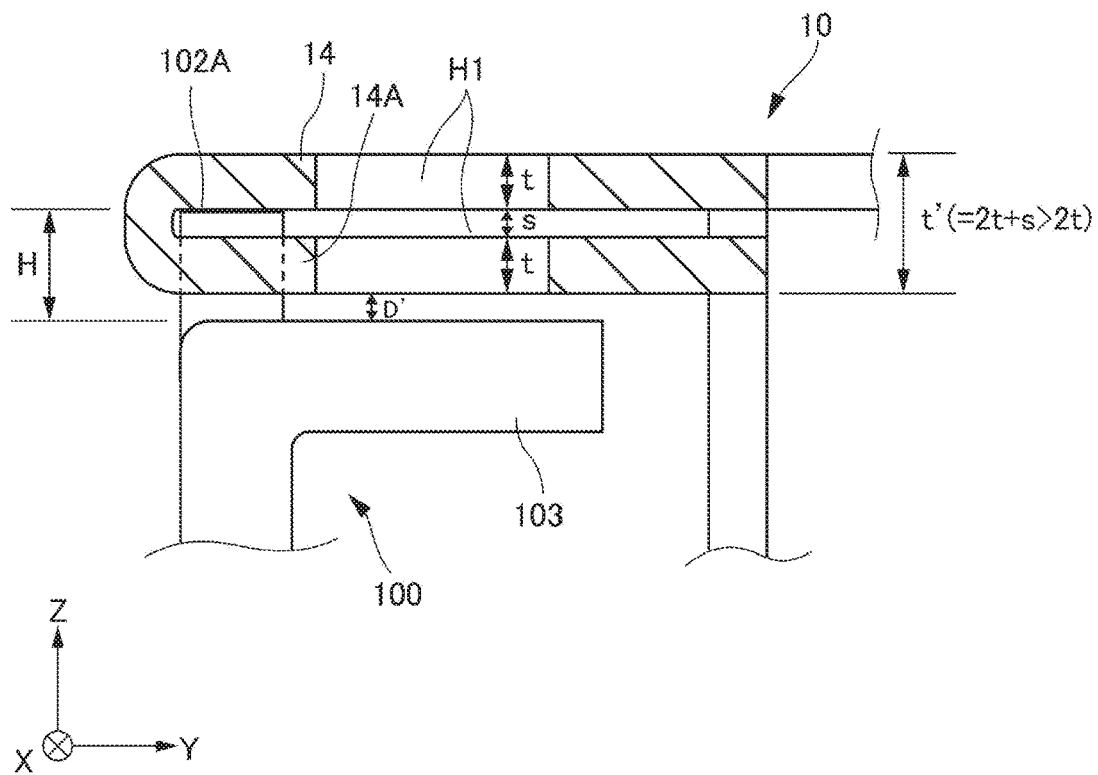

Further, FIG. 8A is a case in which the folded-back part 14A shown in FIG. 7A is folded back so as to contact the back side (Z-axis direction negative side) of the outer peripheral edge part 14; and FIG. 8B is a case in which the folded-back part 14A shown in FIG. 7B is folded back so as to separate from the outer peripheral edge part 14 to some extent.

As described above, in order to easily perform bending processing, it is difficult to increase the plate thickness of the attaching plate 10.

Therefore, if, as shown in FIG. 7A, each of the folded-back parts 14A is folded back so as to contact the back side (Z-axis direction negative side) of the outer peripheral edge part 14, a thickness in a cross-section of part which is constituted by the outer peripheral edge part 14 and the folded-back part 14A is thickness 2t that is twice the thickness t but the plate thickness t is thin and thickness 2t is also not so thick.

On the other hand, if, as shown in FIG. 7B, each of the folded-back parts 14A is folded back so as to separate from the outer peripheral edge part 14 to some extent, thickness t' in a cross-section of part which is constituted by the outer peripheral edge part 14 and the folded-back part 14A can be made thicker than thickness 2t.

In addition, if, as shown in FIG. 7B, the folded-back part 14A is folded back so as to separate from the outer peripheral edge part 14 to some extent, it is structured that when the folded-back part 14A is brought close to the outer peripheral edge part 14, an elastic force acts in a direction of separation.

However, since height H (height in a Z-axis direction) of the step height that goes down to a deep side (Z-axis direction negative side) between the screw fixing part 103 and the peripheral edge part 102A, which is shown in FIG. 8, is not defined in specifications of the switch box 100 and therefore, though there are variations, in most cases, it is a step height higher than thickness 2t (see FIG. 7A and FIG. 8A) and, by extension, thickness t' (see FIG. 7B and FIG. 8B).

Further, in a case in which the height H of the step height is lower than the thickness 2t, when the attaching plate 10 is arranged on the switch box 100, a gap of at least a width which is obtained by subtracting the height H of the step height from the thickness 2t is generated between the attaching plate 10 and the peripheral edge part 102A of the switch box 100; however, in a case in which the height H of the step height is higher than at least thickness 2t, such gap is never generated.

In addition, the height H of the step height is higher than thickness 2T (see FIG. 8A) and, by extension, thickness t' (see FIG. 8B) and therefore, when the attaching plate 10 is arranged so that the outer peripheral edge part 14 contacts the peripheral edge part 102A of the switch box 100, a gap is generated between the screw fixing part 103 and the folded-back part 14A.

Specifically, as shown in FIG. 8A, in a case in which the folded-back part 14A is folded back so as to contact the back side (Z-axis direction negative side) of the outer peripheral edge part 14 (in the case of FIG. 7A), a gap of distance D is generated between the screw fixing part 103 and the folded-back part 14A.

In addition, as shown in FIG. 8B, in a case in which the folded-back part 14A is folded back so as to separate from the outer peripheral edge part 14 to some extent (separation by distance s) (in the case of FIG. 7B), a gap of distance D' is generated between the screw fixing part 103 and the folded-back part 14A.

It should be noted that distance D' is a distance that is smaller than distance D by distance s.

Here, if force FO1 that is necessary to fasten each of the screws N1 in fixing the attaching plate 10 is a force that is larger than the one for changing the plate thickness t which is the thickness of the outer peripheral edge part 14 mounted on the peripheral edge part 102A of the switch box 100, it may tighten the screw N1 at least until the folded-back part 14A contacts the screw fixing part 103; and in the case shown in FIG. 8A, a situation where the outer peripheral edge part 14 is deformed by distance D may occur.

In addition, if the folded-back part 14A is not provided, a situation where the outer peripheral edge part 14 is deformed by the height H of the step height may occur. Therefore, as mentioned earlier, even in a case shown in FIG. 8A, the deformation of the outer peripheral edge part 14 can be reduced more than in a case in which the folded-back part 14A is not provided.

On the other hand, if force FO1 that is necessary to fasten each of the screws N1 in fixing the attaching plate 10 is a force that is larger than the one for changing the plate thickness t which is the thickness of the outer peripheral edge part 14 mounted on the peripheral edge part 102A of the switch box 100, the force FO1, as shown in FIG. 8B, does not exceed a force which is obtained by adding an elastic force FO2, which is generated by the folding back of the folded-back part 14A so as to separate from the outer peripheral edge part 14 to some extent, to a rigidity force FO3 of the plate thickness t (FO1<FO2+FO3), the fastening of the screw N1 stops at a point where the folded-back part 14A contacts the screw fixing part 103.

Therefore, the deformation of the outer peripheral edge part 14 occurs only by within distance D' that is smaller than distance D (see FIG. 8A) and the deformation of the outer peripheral edge part 14 can be significantly reduced.

Thus, a case in which the folded-back part 14A is folded back so as to separate from the outer peripheral edge part 14 to some extent (separation by distance s) (the case of FIG. 7B) is preferable because it allows the deformation of the outer peripheral edge part 14 to be more easily reduced than a case in which the folded-back part 14A is folded back so as to contact the back side (Z-axis direction negative side) of the outer peripheral edge part 14 (the case of FIG. 7A).

In addition, even if the force FO1 that is necessary to fasten each of the screws N1 in fixing the attaching plate 10 exceeds a force that is obtained by adding the elastic force FO2 to the rigidity force FO3 of the plate thickness t (FO1>FO2+FO3), the screw N1 can be fastened only up to a state in which the folded-back part 14A contacts the outer peripheral edge part 14 (a state in which the distance s is 0). Therefore, the deformation of the outer peripheral edge part 14 does not become larger than in the case described in FIG. 8A.

In addition, as shown in FIG. 7B and FIG. 8B, in a case in which each of the folded-back parts 14A is folded back so as to separate from the outer peripheral edge part 14 to some extent (separation by distance s), after each of the screw N1 is fastened, an elastic force between the folded-back part 14A and the outer peripheral edge part 14 act so as to prevent the screw N1 from being loosened and therefore, effects similar to prevention of loosening by a spring washer are exerted.

Further, it is considered that if an inner diameter of each of the first screw holes H1 (FIG. 8) for passing each of the screws N1 (see FIG. 1 and FIG. 2), the first screw holes H1 being formed on the folded-back parts 14A, is such a degree that at least part of the screw N1 comes into contact at the time of a fastening work for fixing the attaching plate 10, also at a stage prior to the folded-back parts 14A contacting the screw fixing parts 103, a stress added to the outer peripheral edge part 14 can be more reduced when the folded-back parts 14A are folded back so as to separate from the outer peripheral edge part 14 to some extent (separation by distance s) as shown in FIG. 7B and FIG. 8B than when the folded-back parts 14A are folded back so as to contact the back side (Z-axis direction negative side) of the outer peripheral edge part 14 as shown in FIG. 7A and FIG. 8A.

Specifically, when part of each of the screw N1 is in contact with an inner peripheral surface of the first screw hole H1 (FIG. 8) of each of the folded-back parts 14A, the folded-back part 14A is brought into a state of being hard to move due to a factor such as a swing resistance with the screw N1.

In addition, in this state, if a force for being pressed to a side of the folded-back part 14A acts on the outer peripheral edge part 14, the outer peripheral edge part 14 is trying to bend to the side of the folded-back part 14A. However, as described earlier, when a gap (distance s) between the folded-back part 14A and the outer peripheral edge part 14 becomes small, a force acts, due to an elastic force FO2, on a side where the folded-back part 14A and the outer peripheral edge part 14 are separated.

Therefore, due to this force that acts on a side where the folded-back part 14A and the outer peripheral edge part 14 are separated, a force for pressing the outer peripheral edge part 14 on the side of the folded-back part 14A is weakened and a stress added to the outer peripheral edge part 14 is reduced.

Further, as shown in FIG. 7A and FIG. 8A, if the folded-back part 14A is folded back so as to contact the back side (Z-axis direction negative side) of the outer peripheral edge part 14, it is not a structure that exerts an elastic force and therefore, it is considered that an effect of reducing a stress, which is added to the outer peripheral edge part 14, due to the elastic force FO2 as described above is not exhibited.

Thus, it is considered that when the folded-back part 14A is folded back so as to separate from the outer peripheral edge part 14 to some extent (separation by distance s) as shown in FIG. 7B and FIG. 8B, an effect of reducing a stress which is added to the outer peripheral edge part 14 can be increased more than when the folded-back part 14A is folded back so as to contact the back side (Z-axis direction negative side) of the outer peripheral edge part 14, as shown in FIG. 7A and FIG. 8A.

On the other hand, if an inner diameter of each of the first screw holes H1 (FIG. 8) for passing each of the screws N1 (see FIG. 1 and FIG. 2), the first screw holes H1 being formed on the outer peripheral edge part 14, is such a degree that at least part of the screw N1 comes into contact at the time of a fastening work for fixing the attaching plate 10, it is considered that the screw N1 contacts the inner peripheral surface of the first screw hole H1 (FIG. 8) of the outer peripheral edge part 14 and the outer peripheral edge part 14 is brought into a state of being hard to move due to a factor such as a swing resistance with the screw N1; and when a force for pressing to the side of the folded-back part 14A is added to the outer peripheral edge part 14, the occurrence of bending of the outer peripheral edge part 14 is prevented as much as the outer peripheral edge part 14 becomes hard to move.

This holds true for both the case in which the folded-back part 14A is folded back so as to contact the back side (Z-axis direction negative side) of the outer peripheral edge part 14 as shown in FIG. 7A and FIG. 8A and the case in which the folded-back part 14A is folded back so as to separate from the outer peripheral edge part 14 to some extent (separation by distance s) as shown in FIG. 7 B and FIG. 8B.

From this, the inner diameter of each of the first screw holes H1 (FIG. 8) for passing each of the screws N1 (see FIG. 1 and FIG. 2), the first screw holes H1 being formed on the outer peripheral edge part 14, is also desirable to be such a degree that at least part of the screw N1 easily comes into contact at the time of a fastening work for fixing the attaching plate 10.

Thus, the inner diameter of the first screw hole H1 (FIG. 8) of the outer peripheral edge part 14 and folded-back part 14A is preferable to be such a degree that at least part of the screw N1 can come into contact at the time of a fastening work for fixing the attaching plate 10.

In addition, as shown in FIG. 7A and FIG. 8A, even in a case in which each of the folded-back parts 14A is folded back so as to contact the back side (Z-axis direction negative side) of the outer peripheral edge part 14, if the screw N1 contacts the inner peripheral surface of the first screw hole H1 (FIG. 8) of the folded-back part 14A, a swing resistance and the like occur and, as with the earlier description, the folded-back part 14A is brought into a state of being hard to move and the outer peripheral edge part 14, which is in a state of being accepted in the folded-back part 14A, also becomes hard to move. Therefore, by making the inner diameter of the first screw hole H1 (FIG. 8) small, the outer peripheral edge part 14 can be made hard to bend (hard to deform) at a stage prior to the folded-back part 14A contacting the screw fixing part 103.

However, as shown in FIG. 7B and FIG. 8B, when the folded-back part 14A is folded back so as to separate from the outer peripheral edge part 14 to some extent (separation by distance s), an effect of reducing a stress, which is added to the outer peripheral edge part 14, due to an elastic force FO2, can be further expected as described earlier. Therefore, it is still preferable that the folded-back part 14A is folded back so as to separate from the outer peripheral edge part 14 to some extent (separation by distance s) as shown in FIG. 7B and FIG. 8B, as compared to a case in which the folded-back part 14A is folded back so as to contact the back side (Z-axis direction negative side) of the outer peripheral edge part 14 as shown in FIG. 7A and FIG. 8A.

In addition, if the folded-back part 14A is not formed, an inner peripheral surface of the first screw hole H1 (FIG. 8) which the screw N1 can contact is only the inner peripheral surface of the first screw hole H1 (FIG. 8) of the outer peripheral edge part 14; however, if the folded-back part 14A is formed, the screw N1 can contact also the inner peripheral surface of the first screw hole H1 (FIG. 8) of the folded-back part 14A. The forming of the folded-back part 14A doubles the probability that the screw N1 will come in contact, and increases the probability that the outer peripheral edge part 14 can be made hard to bend (hard to deform) due to effects such as a swing resistance as described above and therefore, also from this respect, it is preferable that the folded-back part 14A is provided irrespective of whether or not the folded-back part 14A separates from the outer peripheral edge part 14 to some extent (separation by distance s).

On the other hand, in the folded-back part 14A, a part close to the side wall part 12, which does not prevent fitting into the step height, (that is, a part that is to be positioned at an inner side than the peripheral edge part 102A of the switch box 100 shown in FIG. 1) is configured as a wide part 14B that is wider than the width of the step height. Specifically, as shown in FIG. 4, each of the wide parts 14B is formed so as to have a width wider than a width along the side wall part 12 of the recessed part 17.

A part of the outer peripheral edge part 14 of the attaching plate 10, which corresponds to a part where this recessed part 17 is provided, is a part of a flat plate shape and is a part that does not have a rib structure by the side wall part 12 and therefore, has a strength lower than a part where the side wall part 12 is provided.

However, the wide part 14B is provided so as to increase the strength of the part having a lower strength and therefore, deformation that is caused when the screw N1 is fastened as described above can be further reduced.

[Sensor Unit]

Next, the sensor unit 20 will be described with reference mainly to FIG. 9 to FIG. 11.

Figure 9:
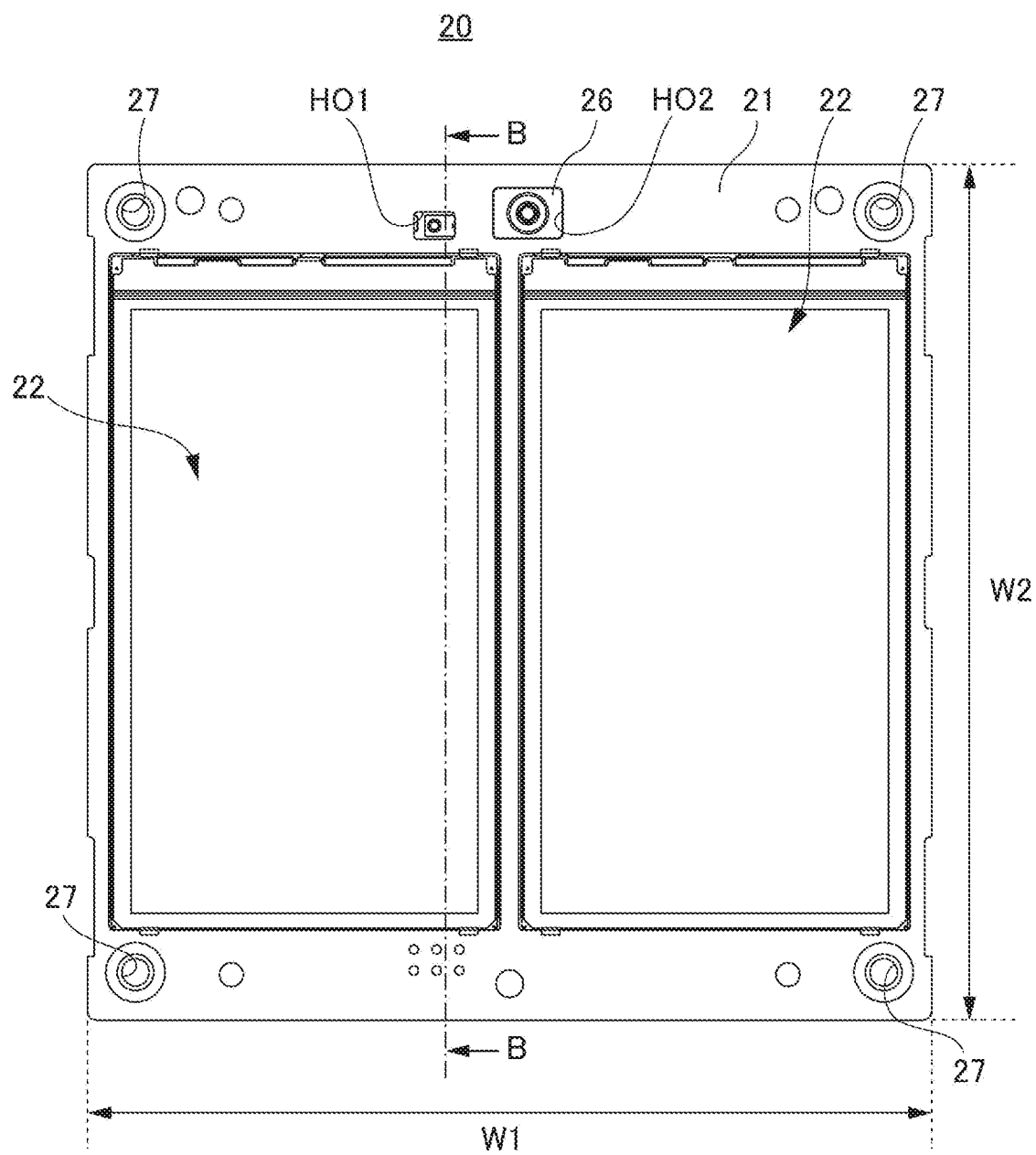
FIG. 9 A plan view when viewing a front side of the sensor unit of the embodiment of the present invention.

FIG. 9 is a plan view when viewing a front side (Z-axis direction positive side) of the sensor unit 20; FIG. 10 is a cross-sectional view taken by cutting the sensor unit 20 along line B-B shown in FIG. 9; and FIG. 11 is a partial cross-section view for explaining a sensor substrate 50.

Figure 10:
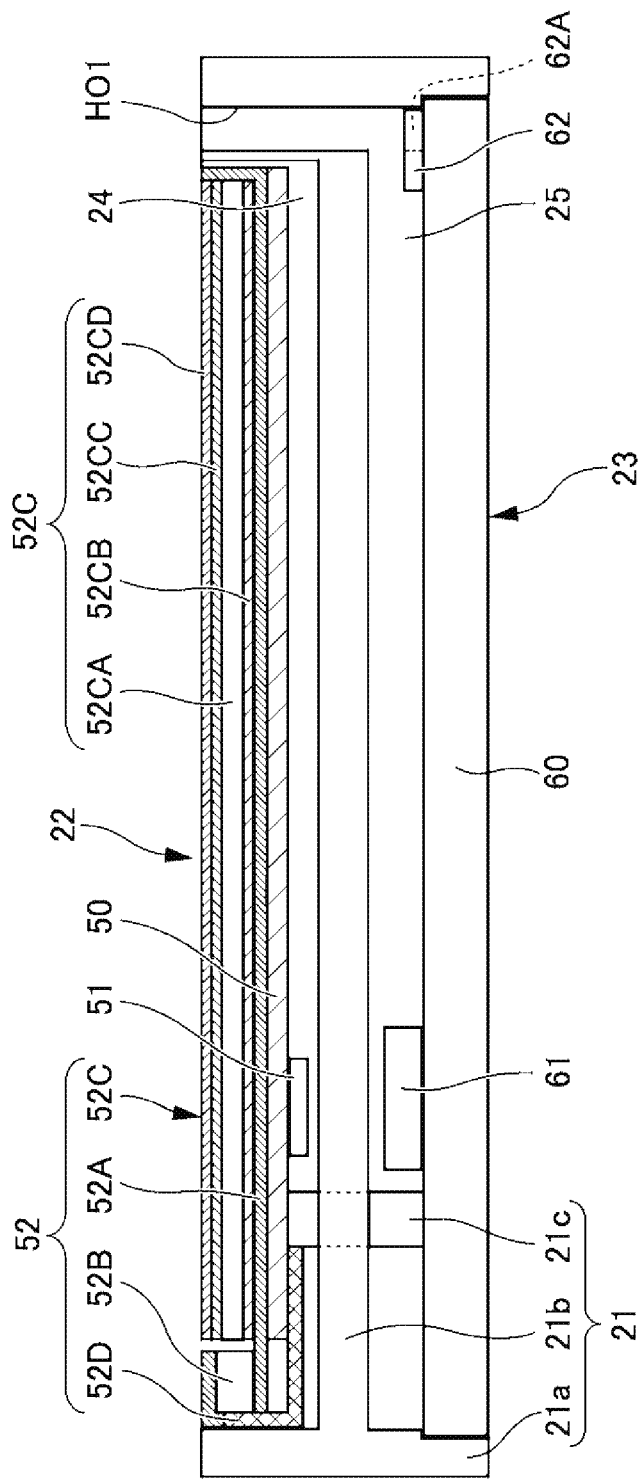
FIG. 10 A cross-sectional view taken by cutting the sensor unit of the embodiment of the present invention along line B-B shown in FIG. 9.

The sensor unit 20 includes, as shown in FIG. 9 and FIG. 10: a casing 21; two sensor parts 22 that are provided within the casing 21; and a control part 23 that is provided within the casing 21.

As shown in FIG. 10, the casing 21 includes: a frame part 21a that is a peripheral wall; a partitioning part 21b that is formed inside the frame part 21a; and a connection part 21c that is formed so as to penetrate the partitioning part 21b. The partitioning part 21b is formed so as to be positioned at an intermediate position (an almost center position in this example) of the height of a front-back direction (Z-axis direction) of the frame part 21a.

In addition, the sensor parts 22 are arranged within a recessed part 24 on a front side (Z-axis direction positive side) of the casing 21; and the control part 23 is arranged in a recessed part 25 on a back side (Z-axis direction negative side) of the casing 21.

(Sensor Part)

The sensor parts 22 each includes: the sensor substrate 50 that is electrically connected to a control substrate 60 of the control part 23 by the connection part 21c; an electrostatic sensor IC 51 that is provided on a back surface side (Z-axis direction negative side) of the sensor substrate 50; and a light emitting part 52.

The light emitting part 52 includes: a case 52A whose front surface side (Z-axis direction positive side) is open; a light source 52B (for example, LED) that is arranged at one end side of the case 52A; a light emitting layer 52C; and a flexible wiring substrate 52D that electrically connects the light source 52B to a feeding pattern for supplying power to the light source 52B that is formed at a part of one end side of the sensor substrate 50.

The light emitting layer 52C includes: a light guide plate 52CA; a reflection member 52CB (for example, reflection sheet or reflection plate) that is arranged on a back surface side (Z-axis direction negative side) of the light guide plate 52CA; and light diffusion members (diffusion sheet 52CC and prism sheet 52CD) that are arranged on a front surface side (Z-axis direction positive side) of the light guide plate 52CA.

In addition, the light source 52B is arranged so that a light emitting surface faces a side surface of the light guide plate 52CA; and when the light source 52B is made to emit light, light enters from the side surface of the light guide plate 52CA into the light guide plate 52CA.

While this incident light is guided within the light guide plate 52CA, part of the light is emitted from a front surface (surface on the Z-axis direction positive side) of the light emitting layer 52C so that a front surface (surface on the Z-axis direction positive side) of the light emitting layer 52C is uniformly lit through the light diffusion members (diffusion sheet 52CC and prism sheet 52CD).

In addition, by the light which is emitted from the front surface (surface on the Z-axis direction positive side) of this light emitting layer 52C, the figures, characters, and the like which are provided on the top panel 40 as described earlier, can be floated up and therefore, even at night or the like, the figures and characters can be visually recognized.

Further, as shown in FIG. 9, the sensor unit 20 includes a human sensor 26 described later and for example, if the human sensor 26 detects that a person exists near the flat switch 1 during a time period such as night, the light source 52B is made to emit light.

Figure 11A:
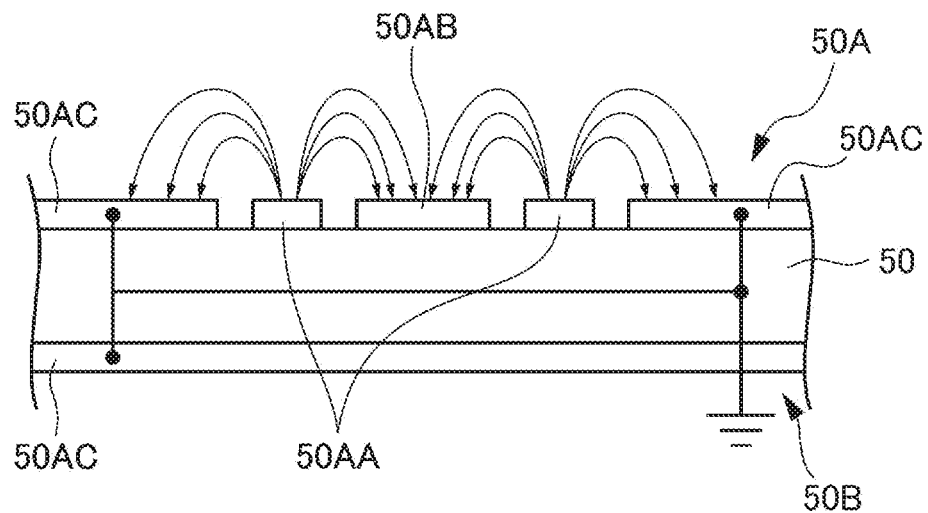
FIG. 11 A partial cross-sectional view for explaining a sensor substrate of the embodiment of the present invention.

On the other hand, as shown in FIG. 11A, on a part which is made to function as an electrostatic capacitance sensor of a front surface 50A (Z-axis direction positive side) of the sensor substrate 50, conductive patterns that become a drive line 50AA and a sensor line 50AB are formed. On the front surface 50A (surface on the Z-axis direction positive side) and back surface 50B (surface on the Z-axis direction negative side) of the sensor substrate 50, conductive patterns which become grounds 50AC electrically connected with each other are formed. The state of an electric field is indicated as electric force lines by arrows. Between the drive line 50AA, the sensor line 50AB, and the grounds 50AC, an electric field is generated.

Figure 11B:
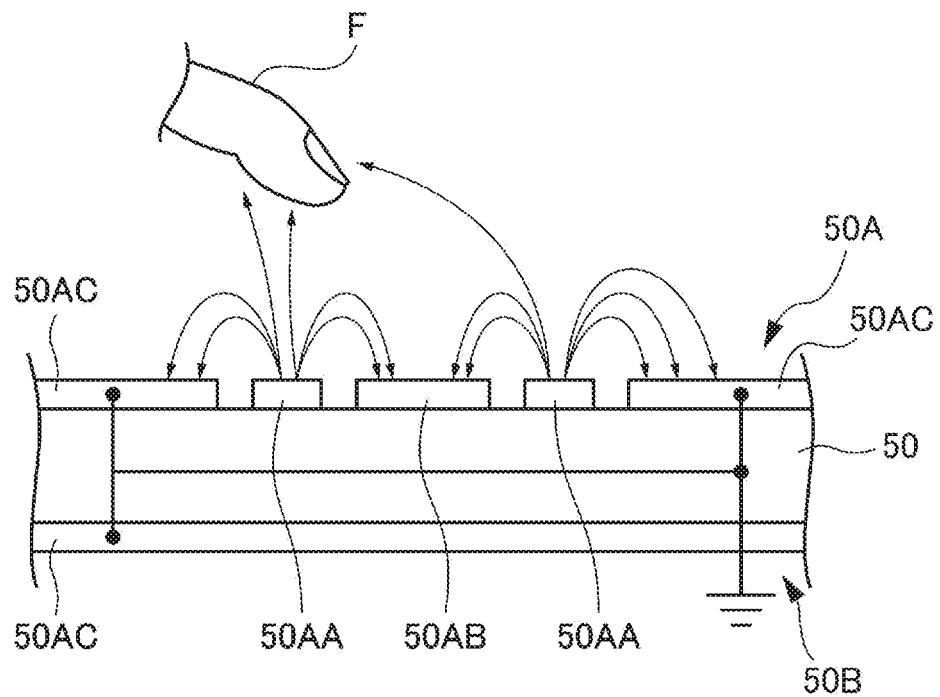

In this state, when a human finger F approaches as shown in FIG. 11B, electric force lines are drawn to a side of the finger F and the number of electric force lines to the sensor line 50AB is reduced.

The electrostatic sensor IC 51 (see FIG. 10) detects this reduction in the electric force lines, that is, a change in electrostatic capacitance and thereby whether or not a switch operation has been performed is detected.

A configuration of the electrostatic sensor is not limited to the above configuration of detecting a change in electric force lines; however, in the case of the configuration of detecting a change in the electric force lines as in the present embodiment, even when the finger F is apart from the front surface 50A (surface on the Z-axis direction positive side) of the sensor substrate 50, detection is possible only by the presence of the finger F in its vicinity.

Therefore, even when the light emitting layer 52C, the top panel 40, and the like are arranged on a side of the front surface 50A (side of the surface on the Z-axis direction positive side) of the sensor substrate 50, it can be excellently detected that the finger F has approached.

(Control Part)

The control part 23 is a part for performing overall control of the flat switch 1 and includes, as shown in FIG. 10: a control substrate 60; a control IC 61 that is installed on a surface of the control substrate 60 facing a side of the partitioning part 21b of the casing 21; and a wireless antenna 62 that is installed on a surface of the control substrate 60 facing the side of the partitioning part 21b of the casing 21.

In addition, as shown in FIG. 9 and FIG. 10, in the casing 21, a through hole HO1 is provided at a position corresponding to an antenna part 62A of the wireless antenna 62, so that communication between an apparatus that is an object to be operated by the flat switch 1 and the wireless antenna 62 is not interfered.

Further, on the surface of the control substrate 60 facing the side of the partitioning part 21b of the casing 21, the human sensor 26 (see FIG. 9) is also arranged; and on the casing 21, a through hole HO2 for arranging the human sensor 26 is provided.

Here, FIG. 10 is one that shows a cross-section of a part in which the control part 23 of the sensor unit 20 is provided; and is a part in which the thickness of a part in which this control part 23 is provided is the thickest in the sensor unit 20. In the present embodiment, the thickness is approximately 9 mm.

On the other hand, as described earlier, in installing the switch box 100 in compliance with the standard for electrical wiring and electrical installation of equipment called NEC (National Electrical Code), the switch box 100 is to be installed so that the peripheral edge part 102A of the vertical wall part 102 is not positioned on a 6.4 mm or deeper side (Z-axis direction negative side) with respect to the appearance surface that is a front surface (outer surface) of a wall (for example, an exterior wall).

For this reason, if a flat plate is installed so as to close the opening of the switch box 100 and the sensor unit 20 is attached to the plate, the sensor unit 20 will protrude from the appearance surface that is a front surface (outer surface) of a wall (for example, an exterior wall).

Therefore, by making the outer shape of the sensor unit 20 into an outer shape that is smaller than an inner shape defined by the peripheral edge part 102A of the switch box 100, it has been made possible that the sensor unit 20 is arranged so as to be embedded into the switch box 100.

Specifically, as shown in FIG. 9, width W1 of the sensor unit 20, which is arranged along a side on which the screw fixing parts 103 (see FIG. 1) of the peripheral edge part 102A (see FIG. 1) of the switch box 100 (see FIG. 1) are provided, is set to a width that is smaller than a separation distance between opposed peripheral edge parts 102A (see FIG. 1) in which the screw fixing parts 103 (see FIG. 1) are not provided; and width W2 of the sensor unit 20 in a direction orthogonal thereto (Y-axis direction) is set to a width smaller than a separation distance between the opposed screw fixing parts 103 (see FIG. 1).

In addition, as described above, the attaching plate 10 including the accommodating part 13 (see FIG. 2), which accommodates the sensor unit 20 that has an outer shape allowing embedding into the switch box 100, is attached and thus, it has been made possible that the sensor unit 20 is installed so as to be embedded into the switch box 100.

Next, procedures for installing the flat switch 1 will be described with reference to FIG. 1 and a more detailed configuration will be described.

First, the switch box 100 is installed within an opening part which is provided on a wall (for example, an exterior wall) to embed the switch box 100.

Specifically, the switch box 100 is installed so that the peripheral edge part 102A of the vertical wall part 102 of the switch box 100 is positioned on a deeper side (Z-axis direction negative side) by a degree of the plate thickness of a plate material that is a forming material of the attaching plate 10 than an appearance surface that is a front surface (outer surface) of the wall (for example, exterior wall).

In addition, the plate material that is a forming material of the attaching plate 10 has a plate thickness of only several mm or less and therefore, even when the switch box 100 is installed as described above, the provision that installation should be performed so that the peripheral edge part 102A of the vertical wall part 102 is not positioned on 6.4 mm or deeper side (Z-axis direction negative side) with respect to the appearance surface, which is stipulated in the standard for electrical wiring and electrical installation of equipment called NEC (National Electrical Code), can be sufficiently satisfied.

Next, the power supply unit 30 is attached to a back surface (surface on the Z-axis direction negative side) of the attaching plate 10, the lead-out wiring 31 including the connector 31A of the power supply unit 30 is led out from a lead-out port 15 (see FIG. 3 and FIG. 4) of the attaching plate 10 to a front surface side (side of a surface on the Z-axis direction positive side) of the attaching plate 10, and the lid part 16 is fixed to the central side bottom surface 11A (see FIG. 3) by a screw so as to close the lead-out port 15.

In addition, as described with reference to FIG. 6, the attaching plate 10 and the closing plates 19 are fastened together to the screw fixing parts 103 (see FIG. 1) of the switch box 100 by screws N1.

When the attaching plate 10 is thus fixed, the peripheral edge part 102A of the vertical wall part 102 of the switch box 100 is positioned on a deeper side (Z-axis direction negative side) by a degree of the plate thickness of the attaching plate 10 and therefore, the outer peripheral edge part 14 of the attaching plate 10 is in a state of being approximately flush with the appearance surface.

Further, when the attaching plate 10 is attached to the switch box 100 and a state indicated by FIG. 2 is set, subsequently, the connector 31A is connected to the sensor unit 20 and the sensor unit 20 is arranged within the accommodating part 13 of the attaching plate 10, and a work for fixing the sensor unit 20 to the attaching plate 10 is performed.

Specifically, as shown in FIG. 2, the central side bottom surface 11A of the attaching plate 10 is formed so that its depth is one-step deeper as viewed from a front side (Z-axis direction positive side) than the lateral side bottom surface 11B, in correspondence with a part of the control part 23 (see FIG. 10) that is a part in which the thickness of the sensor unit 20 is thick; and on its central side bottom surface 11A, the elastic part 18 for elastically supporting the sensor unit 20 is provided.

In addition, when the sensor unit 20 is arranged within the accommodating part 13 so as to make the elastic part 18 perform elastic support, the positions of the engagement screw fixing holes 11BH which are provided on ends of the lateral side bottom surface 11B shown in FIG. 3 and on each of whose inner peripheral surface a screw threaded groove for threadedly engaging each of the engagement screws N2 (see FIG. 1) is formed and the positions of the second screw holes 27 which are provided at four corners of the casing 21 shown in FIG. 9 and are for passing the engagement screws N2 correspond to each other.

Therefore, when each of the engagement screws N2 is threadedly engaged with each of the engagement screw fixing holes 11BH through each of the second screw holes 27 of the sensor unit 20, the sensor unit 20 is to be engaged on a side of the bottom surface 11 by the engagement screws N2 against an elastic force (energizing force) of the elastic part 18.

In addition, by adjusting the amount of threaded engagement of the engagement screws N2 to the engagement screw fixing holes 11BH, positioning in a depth direction of the sensor unit 20 can be performed and therefore, positioning is performed so that the outer peripheral edge part 14 of the attaching plate 10 and the sensor unit 20 are made flush with each other by adjusting the amount of threaded engagement, thereby bringing the sensor unit 20 into a state of being substantially flush with the appearance surface, as with the outer peripheral edge part 14.

Further, even if the switch box 100 is installed on still about several mm deeper side (Z-axis direction negative side), an installation state which is prescribed in the standard for electrical wiring and electrical installation of equipment called NEC (National Electrical Code) can be obtained; however, it is only possible if errors and the like are not considered and substantially, there is no room for installation on a deeper side (Z-axis direction negative side) than this.

Therefore, it is considered that the attaching plate 10 is to be fixed to the switch box 100 so that the outer peripheral edge part 14 of the attaching plate 10 is brought into a state of being substantially flush with the appearance surface. In order to perform installation for the sensor unit 20 not to protrude from the appearance surface, the accommodating part 13 of the attaching plate 10 is preferable to have a depth that allows the sensor unit 20 to be arranged to be flush with at least the outer peripheral edge part 14.

Lastly, in order to improve the appearance by preventing the opening part provided on a wall (for example, exterior wall) for embedding the switch box 100, the sensor unit 20, and the like from being visually recognized, the engaging claws having an L shape of the top panel 40 (not illustrated) are engaged with the engagement parts JO provided on the side surface of the sensor unit 20 and the top panel 40 is attached to the sensor unit 20. Then, the installation work of the flat switch 1 ends.

As described above, in the present embodiment, first, the outer shape of the sensor unit 20 is made into an outer shape that is smaller than an inner shape defined by the peripheral edge part 102A of the switch box 100 and thereby, the sensor unit 20 is allowed to be arranged so as to be embedded in the switch box 100; and therefore, in the switch box 100 which is arranged so that the peripheral edge part 102A is not positioned on a predetermined distance (specifically 6.4 mm) or deeper side (Z-axis negative side) with respect to an appearance surface that is a front surface of the wall, even the sensor unit 20 that has a thickness of approximately 9 mm at the thickest portion in a direction (Z-axis direction) from the peripheral edge part 102A of the switch box 100 toward the bottom part 101 in a state of being installed in the switch box 100 can be installed so as not to protrude from the appearance surface.

Then, by using the attaching plate 10 that allows positional adjustment in a direction of the depth of the sensor unit 20, the sensor unit 20 can be easily installed so as to become substantially flush with the appearance surface.

The present invention has been described based on the embodiment so far; however, the present invention is not limited to the embodiment.

For example, in the above embodiment, the sensor part 22 of the sensor unit 20 includes the light emitting part 52 so that the sensor unit 20 emits light; however, it is not necessary that the sensor unit 20 emits light in performing a function as the flat switch 1; and there is not any problem that the light emitting part 52 is omitted.

Thus, the present invention is not limited to the specific embodiment and can be modified without departing from the spirit thereof, which is obvious to a person skilled in the art from the description of claims.

LIST OF REFERENCE SIGNS 1 flat switch,
10 attaching plate,
11 bottom surface,
11BH engagement screw fixing hole,
12 side wall part,
13 accommodating part,
14 outer peripheral edge part,
18 elastic part,
20 sensor unit,
22 sensor part,
27 second screw hole,
30 power supply unit,
40 top panel,
50 sensor substrate,
100 switch box,
102A peripheral edge part,
103 screw fixing part,
H1 first screw hole,
N2 engagement screw

The invention claimed is:

1. A flat switch to be installed in a switch box having a bottom part and a vertical wall part, the vertical wall part being provided along an outer periphery of the bottom part, wherein the switch box is installed so that, with respect to an appearance surface being a front surface of a wall, a peripheral edge part of the vertical wall part is not positioned on a predetermined distance or deeper side in a depth direction of the wall from the appearance surface, the peripheral edge part being an end part on an opening side of the switch box; and the flat switch comprises a sensor unit whose thickest part in a direction from the peripheral edge part of the switch box to the bottom part is thicker than the predetermined distance in a state of being installed in the switch box and whose outer shape is smaller than an inner shape of the peripheral edge part of the switch box; and the flat switch comprises an attaching plate that is attached to the switch box and is configured to attach the sensor unit;

wherein the attaching place includes:
  an accommodating part configured to accommodate the sensor unit; and
  an outer peripheral edge part that is provided on a tip-end side outer periphery positioned on a side, where the sensor unit of the accommodating part is inserted, of the accommodating part, and that is arranged on a peripheral edge part on a tip-end side of the switch box;

wherein on the outer peripheral edge part, a first screw hole corresponding to a screw fixing part of the switch box is formed, the screw fixing part being positioned on an inside of the switch box;

wherein the screw fixing part of the switch box is bent from the peripheral edge part toward the inside of the switch box and has a step height between the screw fixing part and the peripheral edge part, the step height going down in a direction from the peripheral edge part of the switch box toward the bottom part thereof;

the attaching plate includes a folded-back part, the folded back part being provided at a position corresponding to the screw fixing part in attachment to the switch box and being folded back from the outer peripheral edge part to a back side of the outer peripheral edge part so as be fitted to the step height, the back side being to face a side of the screw fixing part; and the first screw hole is also formed on the folded-back part.

2. The flat switch according to claim 1, wherein the folded-back part is folded back so as to separate from the outer peripheral edge part.

3. The flat switch according to claim 1, wherein
the accommodating part includes:
  a bottom surface;
  a side wall part provided in a periphery of the bottom surface; and
  an elastic part provided on the bottom surface and configured to elastically support the sensor unit, wherein
  the sensor unit has a second screw hole for passing an engagement screw that engages the sensor unit on a side of the bottom surface against an elastic force of the elastic part and performs positioning in a depth direction of the sensor unit; and
  the bottom surface has an engagement screw fixing hole for fixing the engagement screw at a position corresponding to the second screw hole when the sensor unit is accommodated in the accommodating part.

4. The flat switch according to claim 1, wherein the accommodating part has a depth allowing the sensor unit to be arranged to be flush with at least the outer peripheral edge part.

5. The flat switch according to claim 1, wherein
the switch box is a wide-type switch box allowing two or more switches to be arranged; and
the sensor unit has two or more sensor parts each having one sensor substrate.

6. The flat switch according to claim 1, wherein the predetermined distance is 6.4 mm.

\* \* \* \* \*